(12) United States Patent
Mobarak et al.

(10) Patent No.: US 11,264,953 B2
(45) Date of Patent: Mar. 1, 2022

(54) BIAS ARRANGEMENTS FOR IMPROVING LINEARITY OF AMPLIFIERS

(71) Applicant: Analog Devices International Unlimited Company, Limerick (IE)

(72) Inventors: Mohamed Mobarak, Giza (EG); Mohamed Weheiba, Cairo (EG); Mohamed Moussa Ramadan Esmael, Helwan (EG)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 77 days.

(21) Appl. No.: 16/779,221

(22) Filed: Jan. 31, 2020

(65) Prior Publication Data

US 2021/0242835 A1  Aug. 5, 2021

(51) Int. Cl.
*H03F 1/02* (2006.01)
*H03F 3/193* (2006.01)
*H03F 3/21* (2006.01)

(52) U.S. Cl.
CPC ........... *H03F 1/0216* (2013.01); *H03F 3/193* (2013.01); *H03F 3/21* (2013.01); *H03F 2200/15* (2013.01)

(58) Field of Classification Search
CPC .................................................... H03F 1/0216
See application file for complete search history.

(56) References Cited

U.S. PATENT DOCUMENTS

| | | |
|---|---|---|
| 5,923,215 A | 7/1999 | Hans |
| 6,043,714 A | 3/2000 | Yamamoto et al. |
| 6,130,579 A | 10/2000 | Iyer |
| 6,313,705 B1 * | 11/2001 | Dening ................... H03F 1/302 330/276 |
| 6,803,822 B2 * | 10/2004 | Kim ........................ H03F 1/302 330/285 |
| 6,882,227 B2 | 4/2005 | Barry et al. |

(Continued)

FOREIGN PATENT DOCUMENTS

| | | |
|---|---|---|
| CN | 100488034 | 5/2009 |
| EP | 1429452 | 6/2004 |
| WO | 2004105231 | 12/2004 |

OTHER PUBLICATIONS

Yang et al., *A 5-GHz Band WLAN SiGe HBT Power Amplifier IC with Novel Adaptive-Linearizing CMOS Bias Circuit*, IEICE Trans. Electron. vol. E98-C, No. 7, Jul. 2015.
Yen et al., *A 0.25-m 20-dBm 2.4-GHz CMOS Power Amplifier with an Integrated Diode Linearizer*, IEEE Microwave and Wireless Components Letters, vol. 13, No. 2, Feb. 2003, 3 pages.
He et al., *5.25 GHz Linear CMOS Power Amplifier with a Diode-Connected NMOS Bias Circuit*, 978-1-4673-2185-3 © 2012, 4 pages.

(Continued)

*Primary Examiner* — Patricia T Nguyen
(74) *Attorney, Agent, or Firm* — Patent Capital Group

(57) ABSTRACT

Bias arrangements for amplifiers are disclosed. An example bias arrangement for an amplifier includes a bias circuit, configured to produce a bias signal for the amplifier; a linearization circuit, configured to improve linearity of the amplifier by modifying the bias signal produced by the bias circuit to produce a modified bias signal to be provided to the amplifier; and a coupling circuit, configured to couple the bias circuit and the linearization circuit. Providing separate bias and linearization circuits coupled to one another by a coupling circuit allows separating a linearization operation from a biasing loop to overcome some drawbacks of prior art bias arrangements that utilize a single biasing loop.

38 Claims, 9 Drawing Sheets

(56) References Cited

U.S. PATENT DOCUMENTS

| | | | |
|---|---|---|---|
| 6,922,107 B1* | 7/2005 | Green | H03F 1/302 |
| | | | 330/285 |
| 7,005,923 B2 | 2/2006 | Noh et al. | |
| 7,253,681 B2 | 8/2007 | Ichitsubo et al. | |
| 7,710,204 B2 | 5/2010 | Karoui et al. | |
| 8,026,767 B2* | 9/2011 | Chen | H03F 1/56 |
| | | | 330/296 |
| 8,368,470 B2 | 2/2013 | Alidio et al. | |
| 8,624,678 B2 | 1/2014 | Scott et al. | |
| 9,035,697 B2 | 5/2015 | Youssef et al. | |
| 9,160,287 B2 | 10/2015 | Briffa et al. | |
| 9,467,101 B2 | 10/2016 | Ni | |
| 9,634,619 B2 | 4/2017 | Gerard et al. | |
| 9,813,029 B2 | 11/2017 | Zhu et al. | |
| 9,935,588 B2 | 4/2018 | Ni et al. | |
| 2006/0244533 A1 | 11/2006 | Joly et al. | |
| 2007/0096823 A1* | 5/2007 | Wang | H03F 3/191 |
| | | | 330/285 |
| 2007/0252646 A1 | 11/2007 | Leung et al. | |
| 2007/0268074 A1 | 11/2007 | Vejzovic | |
| 2008/0074193 A1* | 3/2008 | Wei | H03F 1/30 |
| | | | 330/296 |
| 2008/0079495 A1* | 4/2008 | Amano | H03F 3/195 |
| | | | 330/296 |
| 2009/0237156 A1 | 9/2009 | Griffiths et al. | |
| 2015/0105033 A1 | 4/2015 | Modi et al. | |
| 2015/0180426 A1 | 6/2015 | Kingsley | |
| 2015/0349715 A1 | 12/2015 | Gerard et al. | |
| 2016/0164469 A1 | 6/2016 | Nobbe et al. | |
| 2016/0094189 A1 | 11/2016 | Lyalin | |
| 2016/0320781 A1 | 11/2016 | Signoff et al. | |
| 2018/0241347 A1 | 8/2018 | Petrovic et al. | |
| 2020/0028477 A1 | 1/2020 | Moussa et al. | |
| 2020/0195209 A1 | 6/2020 | Chen et al. | |

OTHER PUBLICATIONS

Zhang et al., *Design of 900 MHz SiGe Power Amplifier with Linearization Bias Circuit*, Progress in Electromagnetics Research C., vol. 64, 2016, 10 pages.

Noh et al., An Intelligent Power Amplifier MMIC Using a New Adaptive Bias Control Circuit for W-CDMA Applications, IEEE Journal of Solid-State Circuits, vol. 39, No. 6, Jun. 2004, 4 pages.

Vasjanov et al., A Review of Advanced CMOS RF Power Amplifier Architecture Trends for Low Power 5G Wireless Networks, MDPI electronics, Received Sep. 15, 2018; Accepted Oct. 19, 2018; Published Oct. 23, 2018, 17 pages.

Third Order Intercept Measurements, Agilent Technologies, Feb. 15, 2001, 7 pages.

Current Sense Resistors, OHMITE® www.ohmite.com, 2 pages.

Jones, P1dB and P3dB Definitions, Technical Note 002, Aug. 8, 2014, 2 pages.

Riordan, Discrete- and Integrated Control of Power Amplifiers in Base-Station Applications, Analog Dialouge 42-04, Apr. 2008, 4 pages.

Yang et al., A 5-GHz Band WLAN SiGe HBT Power Amplifier IC with Novel Adaptive-Linearizing CMOS Bias Circuit, IEICE Trans. Electron., vol. E98-C, No. 7, Jul. 2015, 8 pages.

Yen et al., A 0.25-μm 20-dBm 2.4-GHz CMOS Power Amplifier with an Integrated Diode Linearizer, IEEE Microwave and Wireless Components Letters vol. 13, No. 2, Feb. 2003.

He et al., 5.25 GHz Linear CMOS Power Amplifier with a Diode-Connected NMOS Bias Circuit, 2012.

English translation of CN101141114 of Description and Claims via Patent Translate.

Non-Final Office Action dated Jun. 21, 2021 in U.S. Appl. No. 17/065,084, 13 pages.

Extended European Search Report issued in EP21151446.8, 10 pages.

\* cited by examiner

BIAS ARRANGEMENTS FOR IMPROVING LINEARITY OF AMPLIFIERS

TECHNICAL FIELD OF THE DISCLOSURE

The present disclosure generally relates to radio frequency (RF) systems and, more particularly, to biasing and linearization techniques for amplifiers in RF systems.

BACKGROUND

Radio systems are systems that transmit and receive signals in the form of electromagnetic waves in the RF range of approximately 3 kilohertz (kHz) to 300 gigaHertz (GHz). Radio systems are commonly used for wireless communications, with cellular/wireless mobile technology being a prominent example, but may also be used for cable communications such as cable television. In both of these types of systems, linearity of various components therein plays a crucial role.

Linearity of an RF component or a system is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency.

Made from semiconductor materials, which are inherently nonlinear, and having to operate at relatively high power levels, power amplifiers are usually the first components to analyze when considering a design of an RF system in terms of linearity. Power amplifier outputs with nonlinear distortions can result in reduced modulation accuracy (e.g., reduced error vector magnitude (EVM)) and/or out-of-band emissions. Therefore, both wireless communication systems (e.g., Long Term Evolution (LTE) and $5^{th}$ generation (5G) systems) and cable communication systems have stringent specifications on power amplifier linearity.

While linearity is also important for small-signal amplifiers such as low-noise amplifiers, the challenges of linearity are particularly pronounced for power amplifiers because such amplifiers are typically required to produce relatively high output-power levels and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating in saturation also typically function at their highest efficiency, which is highly desirable.

As the foregoing illustrates, linearity and efficiency are two performance parameters for which oftentimes an acceptable trade-off has to be found in that improvements in terms of one of these parameters comes at the expense of the other parameter being less than optimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Amplifiers, in particular power amplifiers, that are both linear and efficient (i.e., in which the back-off can be minimized or eliminated) are essential for modern communication systems. Therefore, further improvements with respect to the amplifier design and operation are always desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
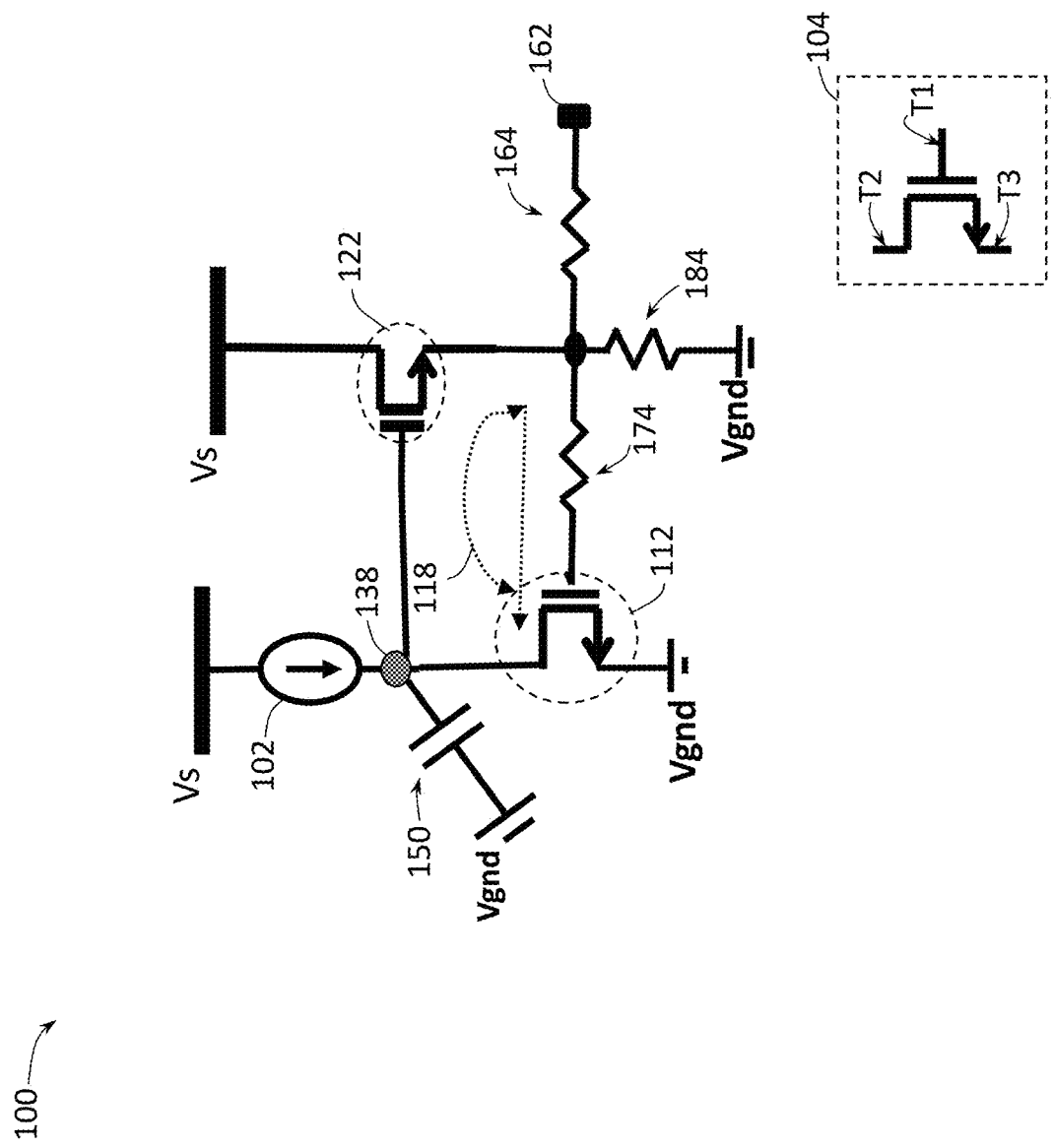
FIG. 1 provides a schematic illustration of an electric circuit diagram of a bias arrangement with a single loop for biasing and linearization, according to prior art.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating bias arrangements for amplifiers of wireless and cable communication systems, proposed herein, it might be useful to first understand phenomena that may come into play in such systems. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of an amplifier being a power amplifier, embodiments of the present disclosure are equally applicable to other types of amplifiers such as low-noise amplifiers, variable gain amplifiers, etc.

In context of wireless radio systems, an antenna is a device that serves as an interface between radio waves propagating wirelessly through space and electric currents moving in metal conductors used with a transmitter or a receiver. During transmission, a radio transmitter may supply an electric signal, which signal is amplified by a power amplifier, and an amplified version of the signal is provided to antenna's terminals. The antenna may then radiate the energy from the signal output by the power amplifier as radio waves. Similarly, in cable radio systems, an electric signal is first amplified by a power amplifier, prior to transmission over a wired cable connection. Therefore, linear and efficient power amplifiers are essential both for wireless and for cable communication systems.

One approach to improving linearity of power amplifiers includes carefully controlling the bias signals provided thereto. For example, adaptive bias circuits have been developed in an attempt to optimize linearity of power amplifiers. Such circuits are "adaptive" in that a bias signal provided to a power amplifier is made dependent on a signal that is to be amplified by a power amplifier, which may be advantageous in terms of improving linearity of the power amplifier. In another example, bias circuits have been developed which include one or more linearization transistors in addition to mirroring transistors. However, inventors of the present disclosure realized that conventional adaptive/linearization biasing techniques and circuits may still have drawbacks that may render them sub-optimal for the latest communication systems such as 5G systems. For example, conventional adaptive/linearization biasing techniques and circuits can be sensitive to process, voltage, and temperature (PVT) variations, may have a limited envelope bandwidth, and may not always be suitable for power amplifiers that utilize stacked transistors.

Various embodiments of the present disclosure provide systems and methods that aim to improve on one or more of the drawbacks described above in providing linear and efficient amplifiers (such as, but not limited to, power amplifiers, low-noise amplifiers, or variable gain amplifiers) for RF systems (such as, but not limited to, phased antenna arrays of 5G cellular technology or cable communication systems). In one aspect of the present disclosure, an example bias arrangement for an amplifier includes a bias circuit, configured to produce a bias signal for the amplifier; a linearization circuit, configured to improve linearity of the amplifier by modifying the bias signal produced by the bias circuit to produce a modified bias signal to be provided to the amplifier; and a coupling circuit, configured to couple the bias circuit and the linearization circuit. Providing separate bias and linearization circuits coupled to one another by a coupling circuit allows separating a linearization operation from a biasing loop to overcome some drawbacks of prior art bias arrangements that utilize a single biasing loop.

As will be appreciated by one skilled in the art, aspects of the present disclosure, in particular aspects of bias arrangements that use separate bias and linearization circuits coupled to one another by a coupling circuit to provide modified bias signals to amplifiers, as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of RF systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art.

Prior Art Bias Arrangement with a Single Loop for Biasing and Linearization

FIG. 1 provides a schematic illustration of a bias arrangement 100 with a single loop for biasing and linearization, according to prior art. As shown in FIG. 1, a bias signal 102, e.g., a bias current, may be provided to a bias circuit transistor 112, which transistor is coupled in a loop 118 (shown in FIG. 1 with a dotted contour with arrows) with a linearization transistor 122. In FIG. 1 and the subsequent drawings, various transistors are shown within dashed oval/circular contours. An inset 104, shown in FIG. 1, illustrates an example transistor indicating what is referred to in the rest of the description as first, second, and third terminals, labeled as T1, T2, and T3, respectively, applicable to all of the present drawings. If a given transistor described herein is implemented as a field-effect transistor (FET), as is shown for both of the transistors of the bias arrangement 100, then, in accordance with the conventional nomenclature, the first terminal T1 is a gate terminal, the second terminal T2 is a drain terminal, and the third terminal T3 is a source terminal. The terminals T1-3T are not specifically labeled in the bias arrangement 100 or in the rest of the drawings in order to not clutter these drawings.

As shown in FIG. 1, the first terminal of the linearization transistor 122 may be coupled to the bias signal 102, e.g., via a node 138. The second terminal of the bias circuit transistor 112 may also be coupled to the node 138 and, therefore, to the linearization transistor 122. Furthermore, a capacitor 150 may be coupled between the node 138 and a ground potential (the ground potential labeled in FIG. 1 and subsequent drawings as "Vgnd"). The second terminals of the linearization transistor 122 may be coupled to a supply voltage (the supply voltage labeled in FIG. 1 and subsequent drawings as "Vs"), while the third terminals of the linearization transistor 122 may be coupled an output 162. FIG. 1 further illustrates a resistor 164 which may be coupled between the third terminal of the linearization transistor 122 and the output 162. FIG. 1 also illustrates a resistor 174, coupled between the first terminal of the bias circuit transistor 112 and the output 162, and a resistor 184, coupled between the third terminal of the linearization transistor 122 and the ground potential.

Inventors of the present disclosure realized that the bias arrangement 100 has several drawbacks. One drawback is that the bias circuit transistor 112 and the linearization transistor 122 share the same loop 118, which may limit linearization that may be realized by the linearization transistor 122, as well as limit mirroring accuracy that the bias circuit transistor 112 may achieve. In addition, sharing of the loop 118 in a manner shown in FIG. 1 may compromise stability of the loop 118. This, in turn, may result in a limited envelope bandwidth as linearizer loop bandwidth may be limited by its stability. In addition, inventors of the present disclosure realized that using a single bias circuit transistor 112 may make the design very sensitive for current mirroring in case stacked transistors are used in the amplifier.

Bias Arrangements with Separate Bias and Linearization Circuits Coupled by a Coupling Circuit Embodiments of the present disclosure are based on recognition that separating bias circuit transistors and linearization transistors so that they are not coupled in a single loop may provide improvements with respect to conventional bias arrangements such as the one shown in FIG. 1.

Figure 2:
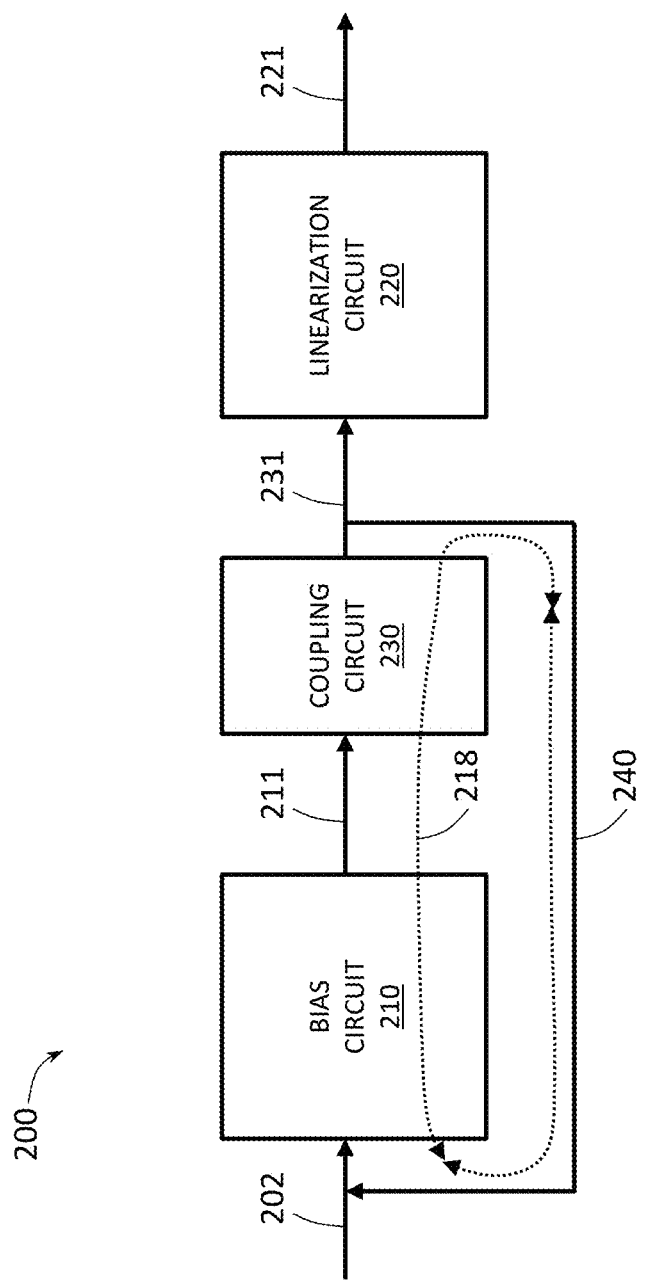
FIG. 2 provides a block diagram illustrating a bias arrangement with separate bias and linearization circuits coupled by a coupling circuit, according to various embodiments of the present disclosure.

FIG. 2 provides a block diagram illustrating a bias arrangement 200 with separate bias and linearization circuits 210, 220, coupled by a coupling circuit 230, according to some embodiments of the present disclosure. As shown in FIG. 2, the bias circuit 210 may be configured to receive an input signal 202 and generate an output signal 211. The input signal 202 may be a bias signal, e.g., a bias current, and the bias circuit 210 may be configured to mirror the input signal 202 to the output, i.e., the output signal 211 may be substantially a mirrored version of the bias signal 202 or a bias voltage. The coupling circuit 230 is configured to receive the output signal 211 from the bias circuit 210 as an input to the coupling circuit 230 and provide an output signal 231, which is based on the bias signal 211 output by the bias circuit 210. The linearization circuit 220 may be configured to receive the output signal 231 from the coupling circuit 230, and generate an output signal 221, which may then be provided to an amplifier (the amplifier not shown in FIG. 2). In particular, the linearization circuit 220 may be configured to improve linearity of the amplifier by modifying the bias signal 211 produced by the bias circuit 210 to produce the output signal 221 which may be referred to as a "modified bias signal" 221 to be provided to the amplifier.

As shown in FIG. 2, the coupling circuit 230 is configured to couple the bias circuit 210 and the linearization circuit 220. Providing the separate bias and linearization circuits 210, 220 coupled to one another by the coupling circuit 230 allows separating a linearization operation from a biasing loop, which may help overcome some drawbacks of prior art bias arrangement 100, provide improvements in terms of PVT variations, and achieve better linearization. In particular, a feedback path 240 may be provided, coupling the output of the coupling circuit 230 to the input of the bias circuit 202, thus forming a biasing loop 218.

In contrast to the biasing loop 118 shown in FIG. 1, the biasing loop 218 does not include the components of the linearization circuit 220. This may allow optimizing the components of the linearization circuit 220 without any bias or stability considerations/limitations, described above. Furthermore, the linearization circuit 220 may be designed without any closed loops, which may advantageously reduce or eliminate limiting envelope bandwidth of the bias arrangement 200.

It should be noted that, while FIG. 2 does not illustrate any additional components in the feedback path 240, in various embodiments, various active or passive components may be included therein. For example, in some embodiments, the feedback path 240 from the output of the coupling circuit 230 to the input of the bias circuit 202 may include a voltage level shifter, which may help provide a compliance voltage for the one or more transistors of the amplifier to which the modified bias signal 221 is provided. Thus, in various embodiments, one or more of voltage level shifters, transistors, resistors, capacitors, amplifiers, operational amplifiers (op-amps), etc., may be coupled between the output of the coupling circuit 230 and the input of the bias circuit 202 in the feedback path 240.

The exact design of the bias arrangement 200 as described above may be realized in many different ways, all of which being within the scope of the present disclosure. In one aspect, although not specifically shown in FIG. 2, each of the bias circuit 210, the linearization circuit 220, and the coupling circuit 230 may include one or more transistors. Therefore, in one example of design variations according to various embodiments of the present disclosure, a choice can be made, individually for each of the bias circuit 210, the linearization circuit 220, and the coupling circuit 230, to employ FETs, bipolar transistors, or a combination of one or more FETs and one or more bipolar transistors. In another example, in various embodiments, a choice can be made, individually for each of the bias circuit 210, the linearization circuit 220, and the coupling circuit 230, to employ N-type transistors (e.g., N-type metal-oxide-semiconductor (NMOS) transistors for the transistors implemented as FETs, or NPN transistors for the transistors implemented as bipolar transistors), P-type transistors (e.g., P-type metal-oxide-semiconductor (PMOS) transistors for the transistors implemented as FETs, or PNP transistors for the transistors implemented as bipolar transistors), or a combination of both. In yet other examples, in various embodiments, a choice can be made as to what type of transistor architecture to employ. For example, any of the transistors of the bias arrangement 200 that are implemented as FETs may be planar transistors or non-planar transistors such as FinFETs, nanowire transistors or nanoribbon transistors. Other possible design variations may include implementing the output 221 of the bias arrangement 200 as an output that is provided as an input to a differential amplifier or for a single-ended amplifier, employing cascode arrangements of two or more transistors in any of the bias circuit 210, the linearization circuit 220, and the coupling circuit 230, etc. Some example implementations of the bias arrangement 200 are shown in FIGS. 3-7. However, any implementation of the bias arrangement 200 in line with the descriptions provided herein is within the scope of the present disclosure.

In FIGS. 3-7, reference numerals used in FIG. 2 indicate elements of the bias arrangements which are the same or analogous to those shown in FIG. 2. For example, each of FIGS. 3-7 illustrates the bias circuit 210, the linearization circuit 220, and the coupling circuit 230, although the details of their specific implementation may be different in different ones of FIGS. 3-7.

Figure 3:
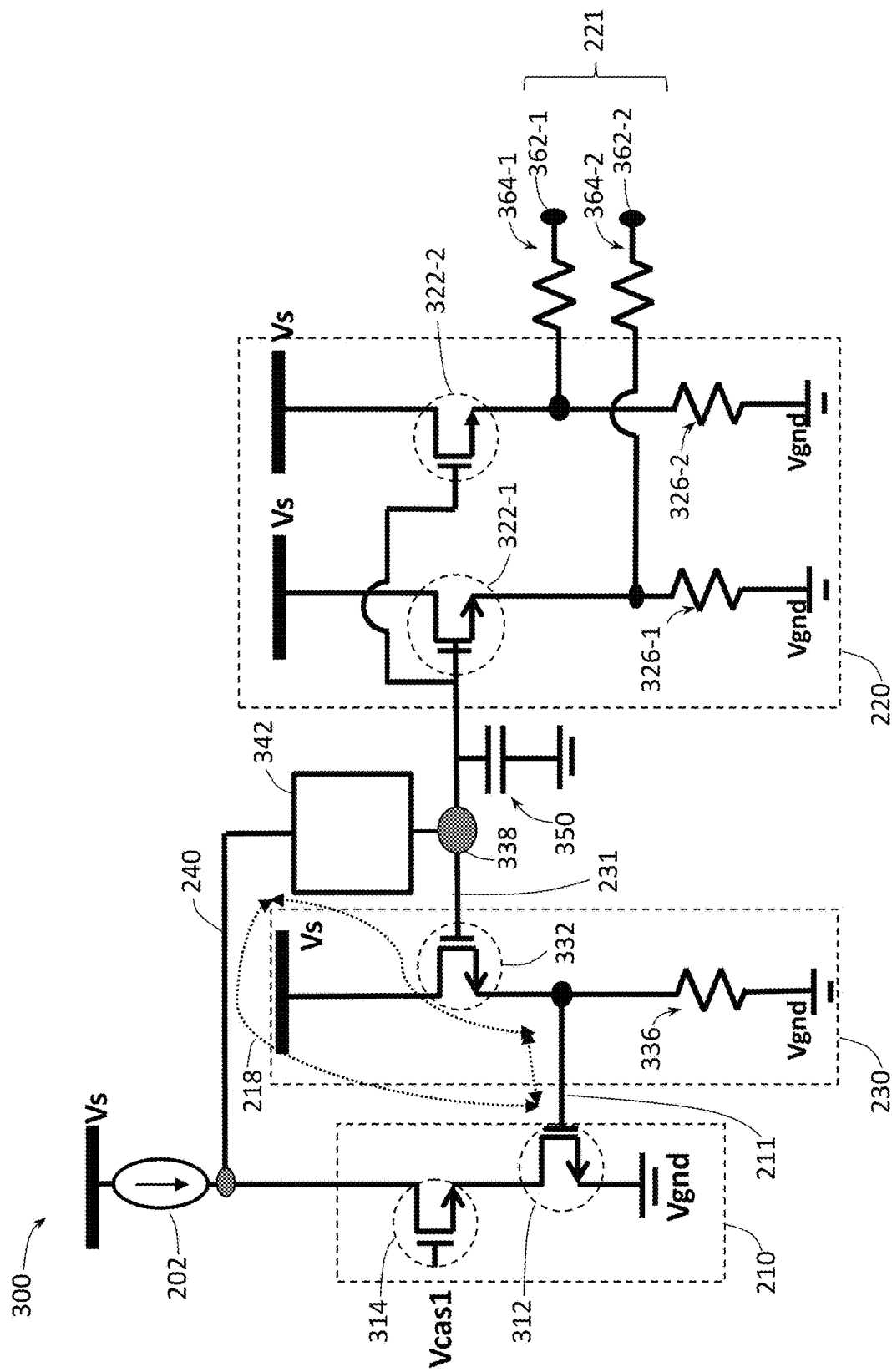
FIGS. 3-7 provide schematic illustrations of electric circuit diagrams of example implementations of the bias arrangement of FIG. 2, according to various embodiments of the present disclosure.

FIG. 3 provides a schematic illustration of an electric circuit diagram of a bias arrangement 300, which is the first example implementation of the bias arrangement 200, according to some embodiments of the present disclosure.

As shown in FIG. 3, in this example, the bias circuit 210 may include a first transistor 312 and a second transistor 314, which may be referred to as first and second "bias circuit transistors," arranged in a cascode arrangement. As known in the art, "cascode arrangement" of a first transistor and a second transistor means that the third terminal of the second transistor is coupled to the second terminal of the first transistor (continuing with the notation of the first, second, and third terminals as was explained with reference to FIG. 1). In this case, this means that the third terminal (i.e., the source terminal for the FET implementation of the transistor 314, shown in FIG. 3) of the second transistor 314 may be coupled to the second terminal (i.e., the drain terminal for the FET implementation of the transistor 312, shown in FIG. 3) of the first transistor 312. The first transistor 312 is similar to the bias circuit transistor 112, shown in FIG. 1, in that it is used to mirror the bias signal 202 to the output of the bias circuit, which is the first terminal of the first transistor 312 (i.e., the gate terminal for the FET implementation of the transistor 312, shown in FIG. 3). This is also indicated in FIG. 3 by illustrating that the output signal 211 is at the first terminal of the first transistor 312. The second transistor 314 may be omitted in some embodiments of the bias arrangement 300, in which case the second terminal of the transistor 312 would be coupled to the bias signal 202, and, eventually, to the supply voltage (for the N-type transistor implementation shown in FIG. 3), e.g., to Vdd (for the FET implementation shown in FIG. 3). However, the embodiments where the second transistor 314 is used may be advantageous in that the bias circuit 210 having at least 2 transistors in a cascode arrangement may provide better mirroring accuracy in mirroring the bias signal 202 to the output of the bias circuit 210. When the second transistor 314 is used, its' second terminal may be coupled to the bias signal 202, and further to the supply voltage (for the N-type transistor implementation shown in FIG. 3), e.g., to Vdd (for the FET implementation shown in FIG. 3), while the first terminal may be coupled to a reference voltage Vcas1, which may be a fixed DC voltage. In some embodiments, the reference voltage Vcas1 may be substantially the same voltage used to bias the cascode in the main power amplifier (the amplifier not shown in arrangement 200). Similar to the bias circuit transistor 112 shown in FIG. 1, the third terminal of the first transistor 312 may be coupled to the ground potential, Vgnd, for the N-type transistor implementation shown in FIG. 3.

As in FIG. 2, the output signal 211, provided at the first terminal of the transistor 312, may be provided from the bias circuit 210 to the coupling circuit 230. The example shown in FIG. 3 illustrates the coupling circuit 230 as a circuit that includes a transistor 332, which may be referred to as a "coupling transistor." The output 211 of the bias circuit 210 may be provided as an input to the coupling circuit 230 by being applied to the third terminal of the coupling transistor 332. For the N-type transistor implementation shown in FIG. 3, the third terminal of the coupling transistor 332 may further be coupled to the ground potential Vgnd, e.g., via a resistor 336, while the second terminal of the coupling transistor 332 may be coupled to the supply voltage (e.g., Vdd). The first terminal of the coupling transistor 332 may be the terminal at which the output 231 of the coupling circuit 230 is provided. The output 231 of the coupling circuit 230 may then be coupled to the input of the bias circuit 210, thus forming the feedback path 240, as described with reference to FIG. 2. The example of FIG. 3 specifically illustrates a further component 342, which may be included in the feedback path 240 in some embodiments (in other embodiments, the feedback path 240 may not include any intermediate components and the first terminal of the coupling transistor 332 may be connected to the input of the bias circuit 210 directly). FIG. 3 illustrates a node 338, which can be seen as a node where the first terminals of the coupling transistor 332 and of the linearization transistors 322 are coupled together, and where each of these first terminals is coupled to the feedback path 240. In some embodiments, the node 338 may also be coupled to a capacitor 350, similar to the capacitor 150 shown in FIG. 1, namely to a first capacitor electrode of the capacitor 350, where the second capacitor electrode of the capacitor 350 may be coupled to the ground potential (for the N-type transistor implementation of FIG. 3). In some embodiments, the capacitor 350 may be used to stabilize the bias loop 218.

Turning to the linearization circuit 220, the linearization circuit 220 shown in FIG. 3 is configured to provide an output for a differential amplifier as the output 221. Thus, in contrast to a single linearization transistor 122 shown in FIG. 1, the linearization circuit 220 incudes two branches— one including a first linearization transistor 322-1 and coupled to a first output node 362-1, and another one including a second linearization transistor 322-2 and coupled to an output node 362-2. Together, the outputs 362-1 and 362-2 form the output 221 for providing a modified bias signal to a differential amplifier (the amplifier not specifically shown in FIG. 3). The signals provided at the output nodes 362-1 and 362-2 may be the same DC signals (i.e., the same bias signals), except that the output node 362-1 may be coupled to a positive input of a differential amplifier, while the output node 362-2 may be coupled to a negative input of a differential amplifier, or vice versa.

For each of the two linearization transistors 322, the first terminal may be coupled to the first terminal of the coupling transistor 332, e.g., via the node 338, and may also be coupled to the bias signal 202, via the feedback path 240, as well as to the capacitor 350. Furthermore, for each of the two linearization transistors 322, for the N-type transistor implementation shown in FIG. 3, the second terminal may be coupled to the supply voltage Vs and the third terminal may be coupled to the ground potential Vgnd, e.g., via the resistor 326-1 for the linearization transistor 322-1 and via the resistor 326-2 for the linearization transistor 322-2. Resistors 364-1 and 364-2 sense the RF input of the power amplifier and couples it to the linearization transistors. Resistors 326-1 and 326-2 set the bias current of the linearization transistors. In some embodiments, one or more of the resistors 326-1, 326-2, and 336 may be replaced by respective current sources (not shown in the present drawings). In some embodiments, the coupling transistor 332 may be substantially a replica of one of the linearization transistors 322, e.g., the coupling transistor 332 may have substantially the same dimensions and be formed of substantially the same materials as one of the linearization transistors 322. In other embodiments, the coupling transistor 332 may have dimensions of any multiple of one of the linearization transistors 322.

Figure 4:
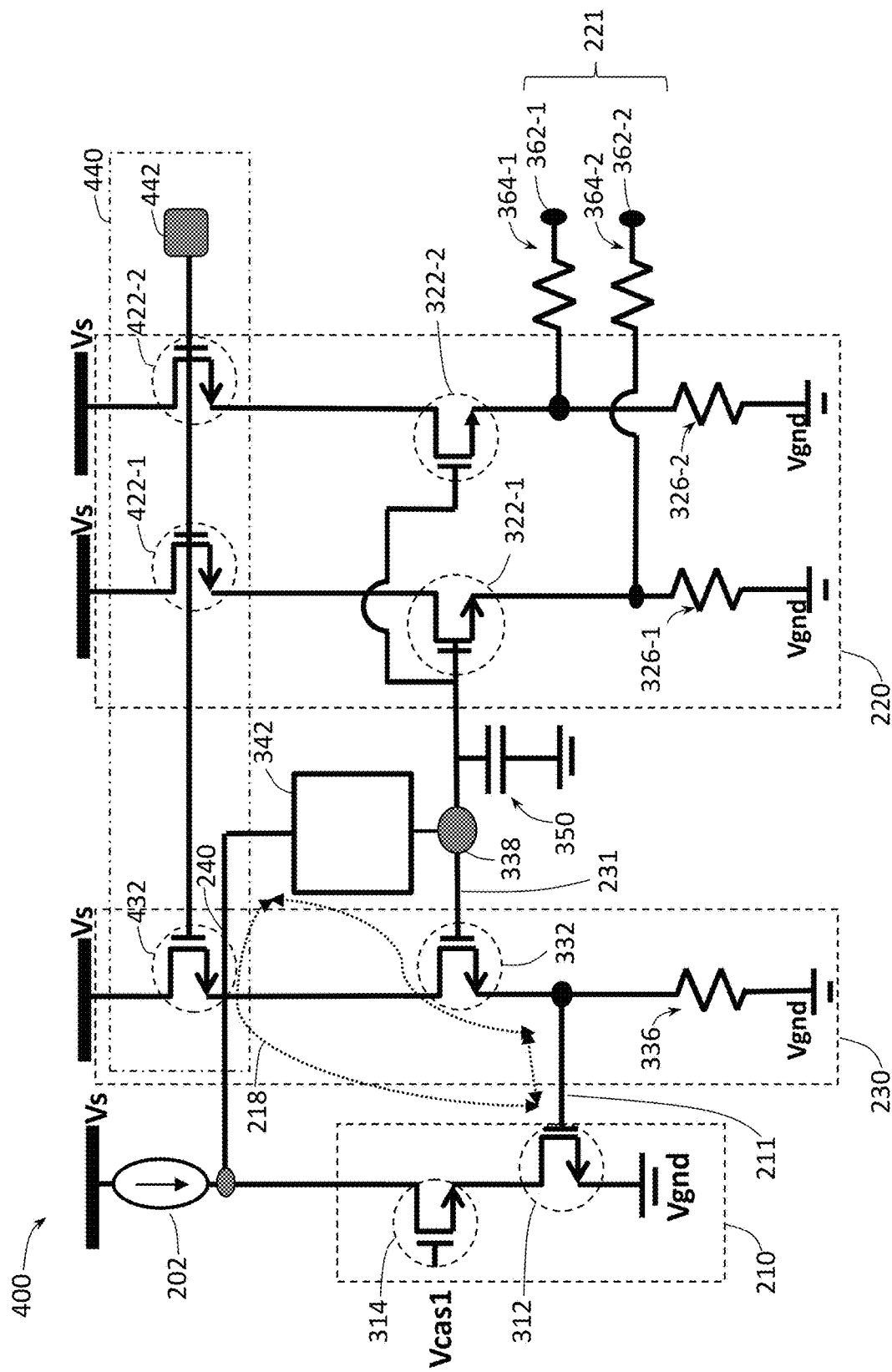

FIG. 4 provides a schematic illustration of an electric circuit diagram of a bias arrangement 400, which is the second example implementation of the bias arrangement 200, according to some embodiments of the present disclosure. The bias arrangement 400 is substantially the same as the bias arrangement 300, except that it further illustrates additional components enclosed within a dash-dotted contour 440. Therefore, in the interests of brevity, descriptions of the elements shown in FIG. 4 which were already provided with reference to FIG. 3 are not repeated, and only the differences between these drawings are described. The bias arrangement 400 illustrates that, in some embodiments, cascode transistors may be added to one or both of the coupling circuit 230 and the linearization circuit 220. For example, in some embodiments, a second coupling transistor 432 may be coupled, in a cascode arrangement, to the coupling transistor 332. In this case, the second terminal of the coupling transistor 332 could be coupled to the supply voltage Vs via the second coupling transistor 432 by virtue of being coupled to the third terminal of the second coupling transistor 432 and the second terminal of the second coupling transistor 432 being then coupled to the supply voltage. Similarly, in some embodiments a second linearization transistor 422 (shown in FIG. 4 as a transistor 422-1 for the first branch of the linearization circuit 220, and shown as a transistor 422-2 for the second branch of the linearization circuit 220) may be coupled, in a cascode arrangement, to the respective linearization transistor 322. In this case, the second terminal of the linearization transistor 322-1 could be coupled to the supply voltage Vs via the second linearization transistor 422-1 by virtue of being coupled to the third terminal of the second linearization transistor 422-1 and the second terminal of the second linearization transistor 422-1 being then coupled to the supply voltage. Further, the second terminal of the linearization transistor 322-2 could be coupled to the supply voltage Vs via the second linearization transistor 422-2 by virtue of being coupled to the third terminal of the second linearization transistor 422-2 and the second terminal of the second linearization transistor 422-2 being then coupled to the supply voltage. The first terminals of each of the cascode transistors of the portion 440 may be coupled to a voltage source 442, which may provide a suitable voltage to, e.g., match the drain-source voltage (Vds) of the linearization transistors 322-1, 322-2 and/or of the transistors included in the amplifier to which the modified bias signal 221 is provided. Addition of the cascode transistors of the portion 440 shown in FIG. 4 may be particularly advantageous if the amplifier also includes such cascode transistors. Although FIG. 4 illustrates that cascode transistors are added to both of the coupling circuit 230 and the linearization circuit 220, in other embodiments of the bias arrangement 400, such cascode transistors may be added to one, but not both, of the coupling circuit 230 and the linearization circuit 220.

Figure 5:
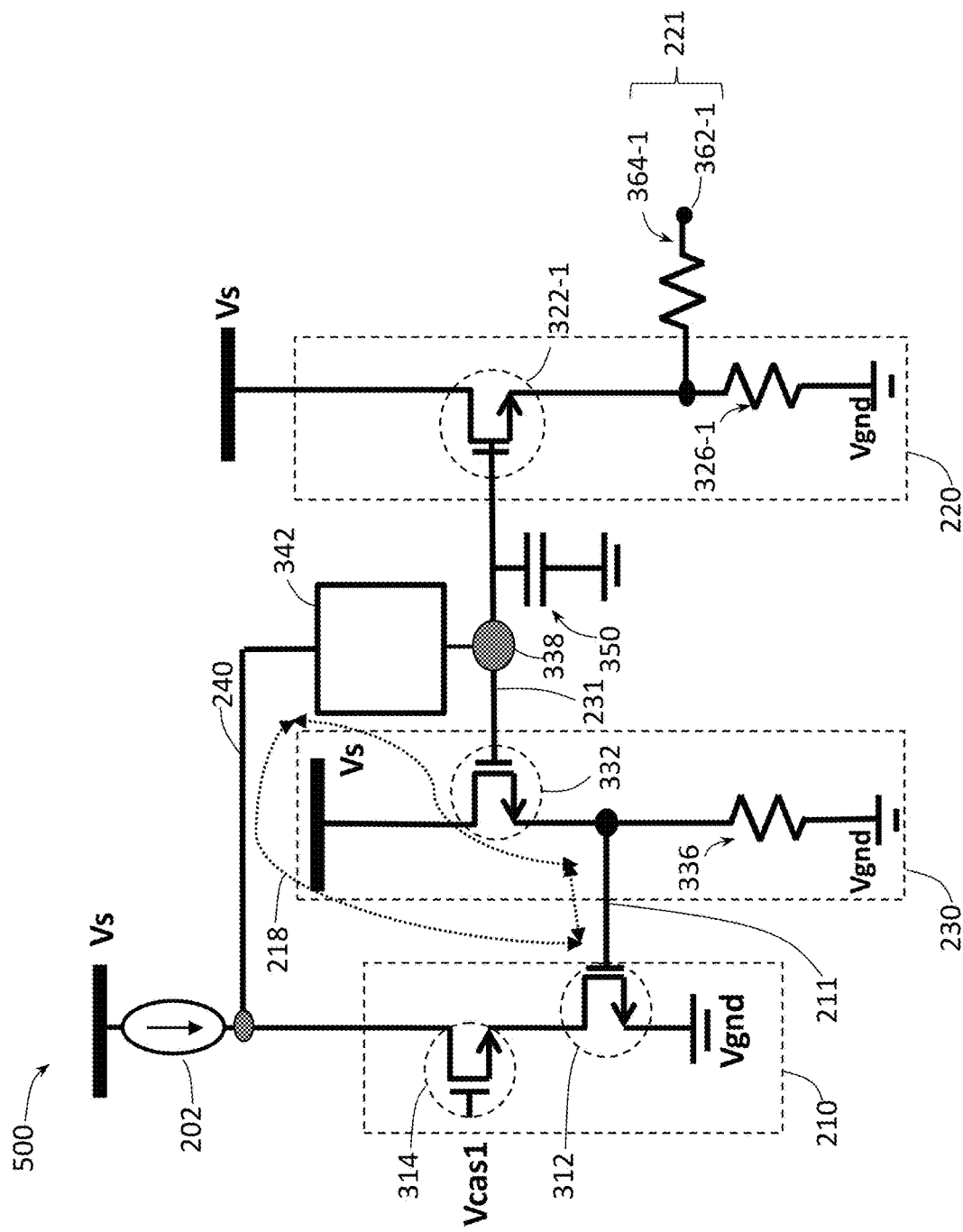

FIG. 5 provides a schematic illustration of an electric circuit diagram of a bias arrangement 500, which is the third example implementation of the bias arrangement 200, according to some embodiments of the present disclosure. The bias arrangement 500 is substantially the same as the bias arrangement 300 and, therefore, in the interests of brevity, descriptions of the elements shown in FIG. 5 which were already provided with reference to FIG. 3 are not repeated, and only the differences between these drawings are described. FIG. 5 differs from FIG. 3 in that, instead of having an output from the linearization circuit 220 for a differential amplifier as was shown in FIG. 3, the bias arrangement 500 has a single output branch. Therefore, one of the two branches of the linearization circuit 220 that were shown in FIG. 3 is not present in FIG. 5 (e.g., the second branch where the reference numerals of various elements had number 2 after the dash, e.g., the branch with the linearization transistor 322-2).

Figure 6:
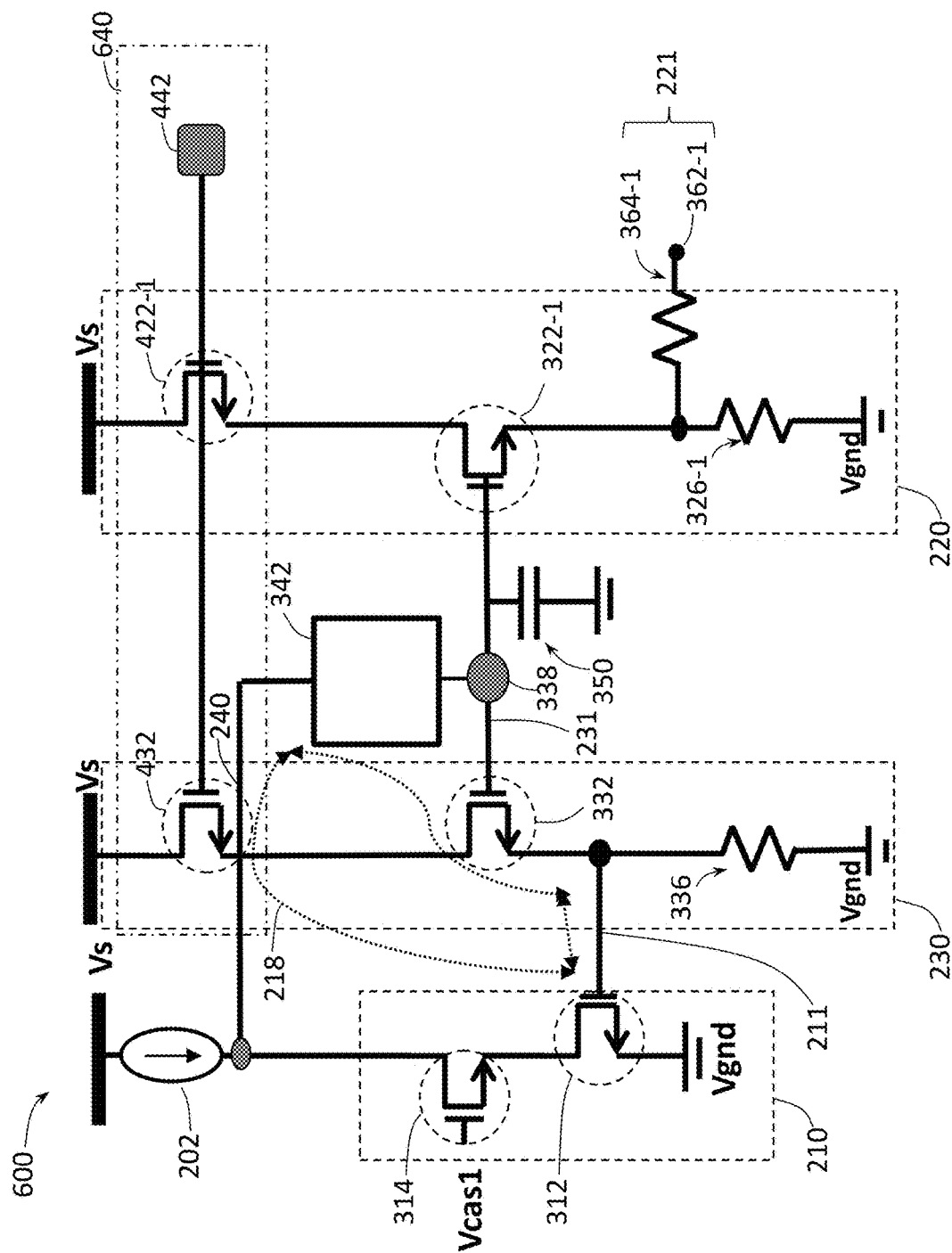

FIG. 6 provides a schematic illustration of an electric circuit diagram of a bias arrangement 600, which is the fourth example implementation of the bias arrangement 200, according to some embodiments of the present disclosure. The bias arrangement 600 is substantially the same as the bias arrangement 500, except that it further illustrates additional components enclosed within a dash-dotted contour 640. Therefore, in the interests of brevity, descriptions of the elements shown in FIG. 6 which were already provided with reference to FIG. 5 are not repeated, and only the differences between these drawings are described. Similar to the bias arrangement 400, the bias arrangement 600 illustrates that, in some embodiments, cascode transistors may be added to one or both of the coupling circuit 230 and the linearization circuit 220. Such cascode transistors may be as those described with reference to FIG. 4, therefore, the same reference numerals are used in FIG. 6 as the ones used in FIG. 4. For example, in some embodiments, the second coupling transistor 432 may be coupled, in a cascode arrangement, to the coupling transistor 332, as described above. Similarly, in some embodiments, the second linearization transistor 422-1 may be coupled, in a cascode arrangement, to the linearization transistor 322-1, also as described above. Addition of the cascode transistors of the portion 640 shown in FIG. 6 may be particularly advantageous if the amplifier also includes such cascode transistors.

Each of FIGS. 3-6 illustrates embodiments where NMOS transistors are used to implement various transistors of the bias circuit 210, the linearization circuit 220, and the coupling circuit 230. In other embodiments of the bias arrangements shown in FIGS. 3-6, one or more of the NMOS transistors of any of the bias arrangements 300, 400, 500, and 600 may be replaced with N-type bipolar transistors, i.e., with NPN transistors. For such embodiments, descriptions provided above are still applicable, except that for such bipolar transistors, the "first terminals" described above are the base terminals (i.e., the terminals that were the gate terminals for the FETs described above), the "second terminals" are the collector terminals (i.e., the terminals that were the drain terminals for the FETs described above), and the "third terminals" are the emitter terminals (i.e., the terminals that were the source terminals for the FETs described above). Thus, in various embodiments of the bias arrangement 200, transistors used in the bias circuit 210, the linearization circuit 220, and the coupling circuit 230 may be NMOS transistors, NPN transistors, or a combination of NMOS and NPN transistors.

Figure 7:
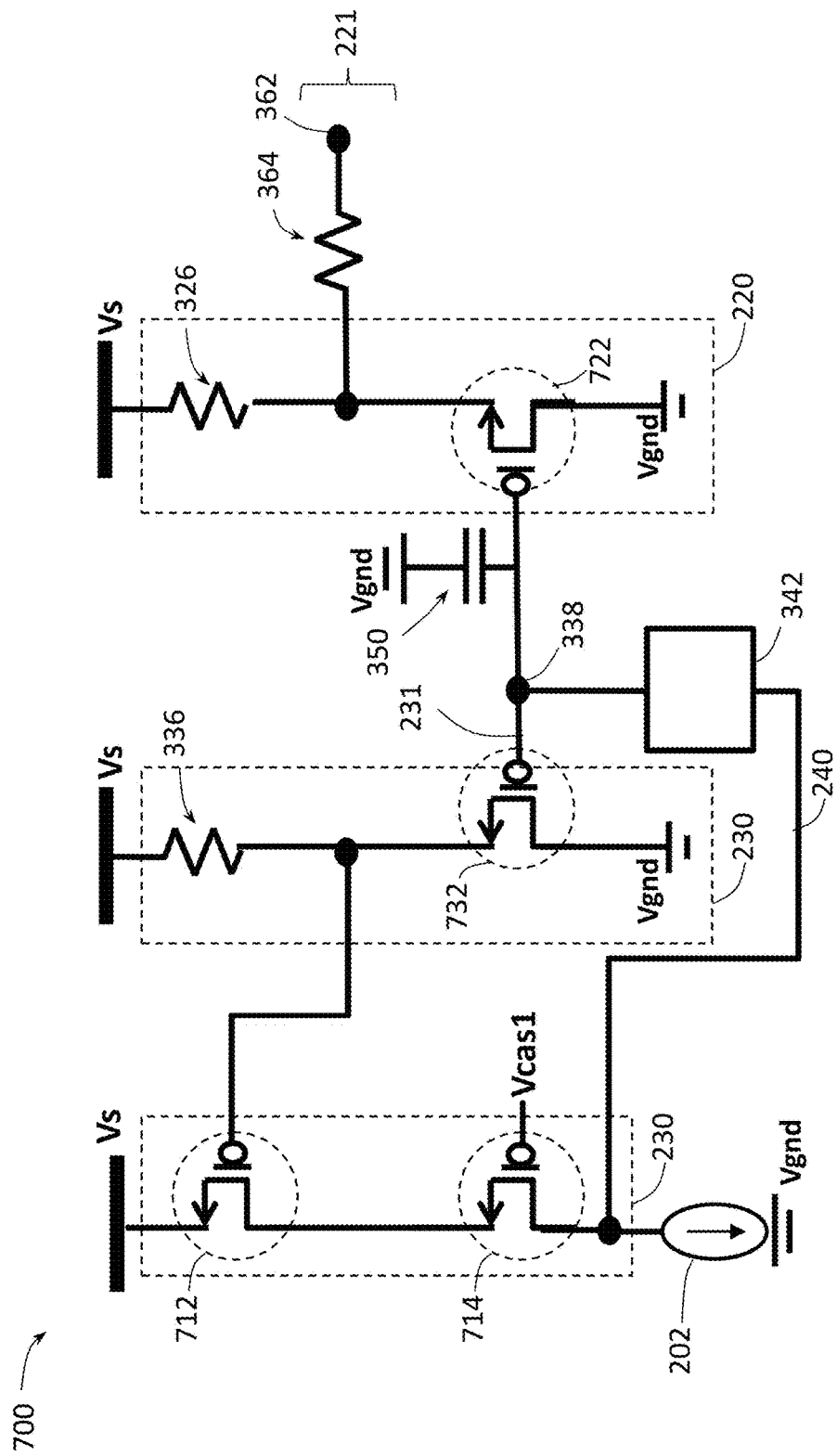

Furthermore, while each of FIGS. 3-6 illustrates and the description above indicates that the bias arrangement 200 may include various transistors of the N-type of transistors (e.g., NMOS or NPN transistors), in further embodiments, any of these transistors may be implemented as P-type transistors (e.g., PMOS or PNP transistors). For such embodiments, descriptions provided above are still applicable, except that for the P-type transistors, the supply voltage Vs described above for the N-type transistors is to be replaced with the ground potential Vgnd, and vice versa. An example of this is illustrated in FIG. 7, providing an electric circuit diagram of a bias arrangement 700, which is the fifth example implementation of the bias arrangement 200, according to some embodiments of the present disclosure. The bias arrangement 700 is substantially the same as the bias arrangement 500, except that all of the NMOS transistors shown in FIG. 5 are replaced with PMOS transistors in FIG. 7. Thus, transistors 712, 714, 722-1 and 732, shown in FIG. 7, are analogous to the transistors 312, 314, 322-1 and 332, shown in FIG. 5, except that the transistors of FIG. 7 are PMOS transistors. Similar modifications to FIGS. 3, 4, and 6 could be carried out in the same manner and, therefore, are not shown in the present drawings. Furthermore, in various embodiments of the bias arrangement 200, transistors used in the bias circuit 210, the linearization circuit 220, and the coupling circuit 230 may be P-type transistors other than PMOS transistors, e.g., PNP transistors. Thus, in various embodiments of the bias arrangement 200, transistors used in the bias circuit 210, the linearization circuit 220, and the coupling circuit 230 may be PMOS transistors, PNP transistors, or a combination of PMOS and PNP transistors. Still further, in various embodiments of the bias arrangement 200, transistors used in the bias circuit 210, the linearization circuit 220, and the coupling circuit 230 may be N-type transistors, P-type transistors, or a combination of N-type and P-type transistors.

Example Antenna Apparatus

As described above, embodiments of the present disclosure related to bias arrangements for amplifiers are applicable to wireless as well as cable communication systems. For illustration purposes only, one example communication system/apparatus (in particular, one example of a wireless communication system/apparatus) that may include one or more amplifiers biased by any of the bias arrangements described herein is shown in FIG. 8 and described below.

Figure 8:
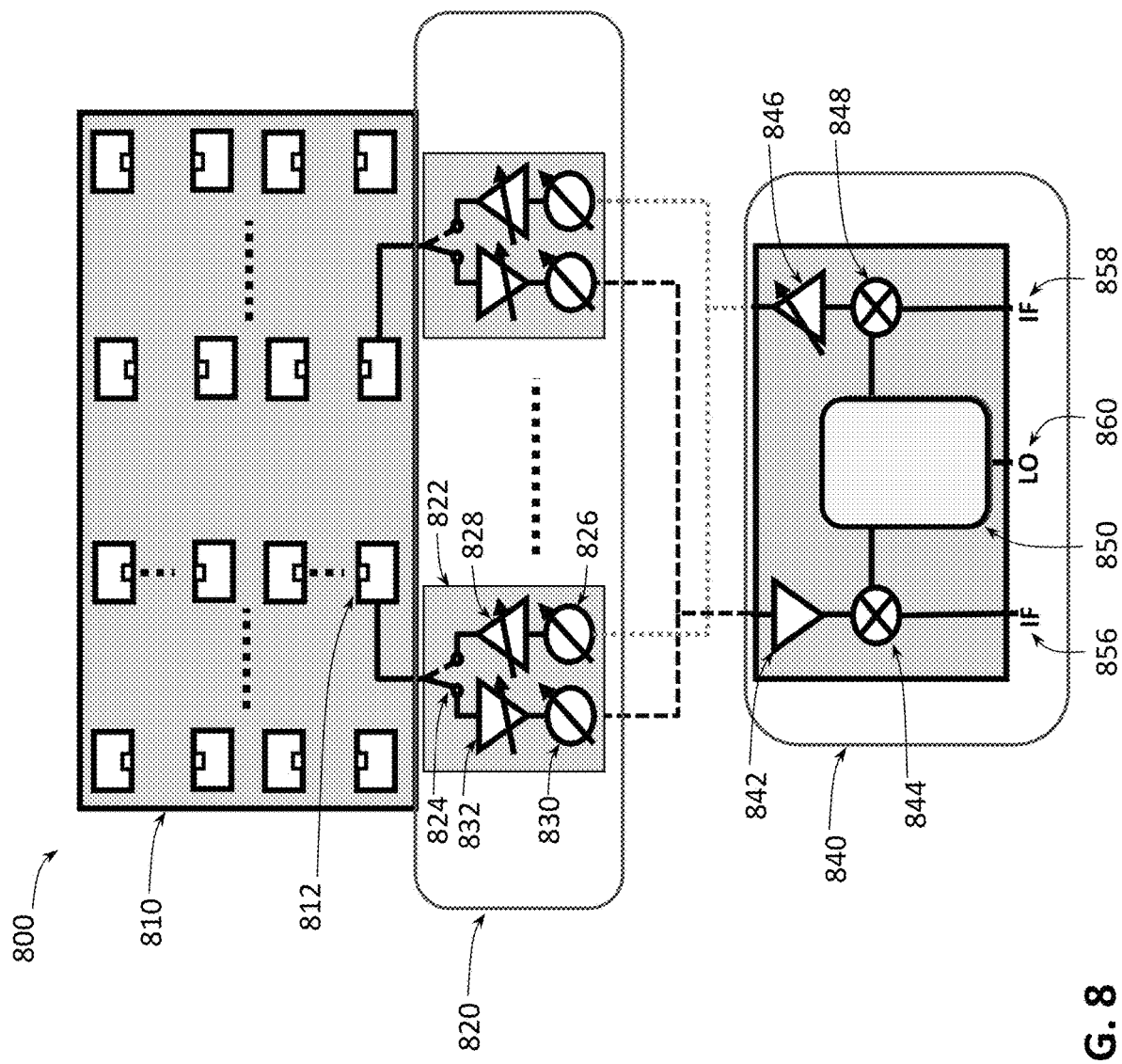
FIG. 8 provides a block diagram illustrating an antenna apparatus with amplifiers that may be biased by a bias arrangement with separate bias and linearization circuits coupled by a coupling circuit, according to some embodiments of the present disclosure.

FIG. 8 provides a schematic illustration of an antenna apparatus 800, e.g., a phased array system/apparatus, according to some embodiments of the present disclosure. As shown in FIG. 8, the antenna apparatus 800 may include an antenna array 810, a beamformer array 820, and an up/down converter (UDC) circuit 840. Any of the amplifiers of the antenna apparatus 800, e.g., any of amplifiers 828, 832, 842, and 846, described herein, may be biased by any of the bias arrangements described herein, e.g., by any embodiments of the bias arrangements described with reference to FIGS. 2-7.

In general, the antenna array 810 may include one or more, typically a plurality of, antenna elements 812 (only one of which is labeled with a reference numeral in FIG. 8 in order to not clutter the drawing). In various embodiments, the antenna elements 812 may be radiating elements or passive elements. For example, the antenna elements 812 may include dipoles, open-ended waveguides, slotted waveguides, microstrip antennas, and the like. In some embodiments, the antenna elements 812 may include any suitable elements configured to wirelessly transmit and/or receive RF signals. Although FIG. 8 illustrates a certain number of antenna elements 812, it is to be understood that various embodiments may be implemented with an array of any number of two or more antenna elements. Furthermore, various embodiments of the bias arrangements, disclosed herein, may be implemented in different types of antenna arrays, such as time domain beamformers, frequency domain beamformers, dynamic antenna arrays, antenna arrays, passive antenna arrays, and the like.

Similarly, the beamformer array 820 may include one or more, typically a plurality of, beamformers 822 (only one of which is labeled with a reference numeral in FIG. 8 in order to not clutter the drawing). The beamformers 822 may be seen as transceivers (e.g., devices which may transmit and/or receive signals, in this case—RF signals) that feed to antenna elements 812. In some embodiments, a single beamformer 822 of the beamformer array 820 may be associated with a single antenna element 812 of the antenna array 810 in a one-to-one correspondence (i.e., different beamformers 822 may be associated with different antenna elements 812). In other embodiments, more than one beamformers 822 may be associated with a single antenna element 812, e.g., two beamformers 822 may be associated with a single antenna element 812, e.g., if such antenna element is a dual polarization antenna element.

In some embodiments, each of the beamformers 822 may include a switch 824 to switch the path from the corresponding antenna element 812 to the receiver or the transmitter path. Although not specifically shown in FIG. 8, in some embodiments, each of the beamformers 822 may also include another switch to switch the path from a signal processor (also not shown) to the receiver or the transmitter path. As shown in FIG. 8, in some embodiments, the transmitter path (TX path) of each of the beamformers 822 may include a phase shifter 826 and an amplifier 828, while the receiver path (RX path) may include a phase adjusted 830 and an amplifier 832. In some embodiments, one or more of the amplifiers 828, 832 may be a variable (e.g., programmable) gain amplifier. In some embodiments, the amplifier 828 may be a power amplifier, e.g., a variable (e.g., programmable) gain power amplifier, biased by any of the bias arrangements described herein. In various such embodiments, the amplifier 828 may include any suitable power amplifier, such as, but not limited to, one of a Doherty power amplifier, a class A power amplifier, a class B power amplifier, a class AB power amplifier, or a class C power amplifier. In some embodiments, the amplifier 832 may be a low-noise amplifier, e.g., a variable (e.g., programmable) gain low-noise amplifier, biased by any of the bias arrangements described herein. The phase shifter 826 may be configured to adjust the phase of the RF signal to be transmitted (TX signal) by the antenna element 812 and the amplifier 828 may be configured to adjust the amplitude of the TX signal to be transmitted by the antenna element 812. Similarly, the phase shifter 830 and the amplifier 832 may be configured to adjust the RF signal received (RX signal) by the antenna element 812 before providing the RX signal to further circuitry, e.g., to the UDC circuit 840, to the signal processor (not shown), etc. The beamformers 822 may be considered to be "in the RF path" of the antenna apparatus 800 because the signals traversing the beamformers 822 are RF signals (i.e., TX signals which may traverse the beamformers 822 are RF signals upconverted by the UDC circuit 840 from lower frequency signals, e.g., from intermediate frequency (IF) signals or from baseband signals, while RX signals which may traverse the beamformers 822 are RF signals which have not yet been downconverted by the UDC circuit 840 to lower frequency signals, e.g., to IF signals or to baseband signals).

Although a switch is shown in FIG. 8 to switch from the transmitter path to the receive path (i.e., the switch 824), in other embodiments of the beamformer 822, other components can be used, such as a duplexer. Furthermore, although FIG. 8 illustrates an embodiment where the beamformers 822 include the phase shifters 826, 830 (which may also be referred to as "phase adjusters") and variable gain amplifiers 828, 832, in other embodiments, any of the beamformers 822 may include other components to adjust the magnitude and/or the phase of the TX and/or RX signals. In yet further embodiments, one or more of the beamformers 822 may not include the phase shifter 826 and/or the phase shifter 830 because the desired phase adjustment may, alternatively, be performed using a phase shift module in the LO path. In other embodiments, phase adjustment performed in the LO path may be combined with phase adjustment performed in the RF path using the phase shifters of the beamformers 822.

Turning to the details of the UDC circuit, in general, the UDC circuit 840 may include an upconverter and/or downconverter circuitry, i.e., in various embodiments, the UDC circuit 840 may include:

1) an upconverter circuit but no downconverter circuit,
2) a downconverter circuit but no upconverter circuit, or
3) both an upconverter circuit and a downconverter circuit.

As shown in FIG. 8, the downconverter circuit of the UDC circuit 840 may include an amplifier 842 and a mixer 844, while the upconverter circuit of the UDC circuit 840 may include an amplifier 846 and a mixer 848. Furthermore, the UDC circuit 840 may further include a phase shift module 850, configured to provide phase shifting in the LO path.

In some embodiments, a single UDC circuit 840 may provide upconverted RF signals to and/or receive RF signals to be downconverted from any one of the beamformers 822. Thus, a single UDC circuit 840 may be associated with a plurality of beamformers 822 of the beamformer array 820 (e.g., there may be 48 beamformers 822 in the beamformer array 820, associated with 48 antenna elements 812 of the antenna array 810). This is schematically illustrated in FIG. 8 with dashed lines and dotted lines connecting various elements of the beamformer array 820 and the UDC circuit 840. Namely, FIG. 8 illustrates that the dashed lines may connect the downconverter circuit of the UDC circuit 840 (namely, the amplifier 842) to the RX paths of two different beamformers 822, and that the dotted lines may connect the upconverter circuit of the UDC circuit 840 (namely, the amplifier 846) to the TX paths of two different beamformers 822.

In some embodiments, the mixer 844 in the downconverter path of the UDC circuit 840 may have two inputs and one output. The two inputs of the mixer 844 include an input from the amplifier 842, which may, e.g., be a low-noise amplifier, and an input from the phase shift module 850. The amplifier 842 may be an amplifier biased by any of the bias arrangements described herein. The one output of the mixer 844 is an output to provide the downconverted signal 856, which may, e.g., be an IF signal 856. The mixer 844 may be configured to receive an RF RX signal from the RX path of one of the beamformers 822, after it has been amplified by the amplifier 842, at its' first input and receive a signal from the phase shift module 850 at its' second input, and mix these two signals to downconvert the RF RX signal to a lower frequency, producing the downconverted RX signal 856, e.g., the RX signal at the IF. Thus, the mixer 844 in the downconverter path of the UDC circuit 840 may be referred to as a "downconverting mixer."

In some embodiments, the mixer 848 in the upconverter path of the UDC circuit 840 may have two inputs and one output. The two inputs of the mixer 848 include an input from the phase shift module 850 and a TX signal 858 of a lower frequency, e.g., the TX signal at IF. The one output of the mixer 848 is an output to the amplifier 846. The amplifier 846 may be an amplifier that is biased by any of the bias arrangements described herein. In some embodiments, the amplifier 846 may be a power amplifier. In various such embodiments, the amplifier 846 may include any suitable power amplifier, such as, but not limited to, one of a Doherty power amplifier, a class A power amplifier, a class B power amplifier, a class AB power amplifier, or a class C power amplifier. The mixer 848 may be configured to receive an IF TX signal 858 (i.e., a lower frequency, e.g. IF, signal to be transmitted) at its' first input and receive a signal from the phase shift module 850 at its' second input, and mix these two signals to upconvert the IF TX signal to the desired RF frequency, producing the upconverted RF TX signal to be provided, after it has been amplified by the power amplifier 846, to the TX path of one of the beamformers 822. Thus, the mixer 848 in the upconverter path of the UDC circuit 840 may be referred to as a "upconverting mixer."

As is known in communications and electronic engineering, an IF is a frequency to which a carrier wave may be shifted as an intermediate step in transmission or reception. The IF signal may be created by mixing the carrier signal with an LO signal in a process called heterodyning, resulting in a signal at the difference or beat frequency. Conversion to IF may be useful for several reasons. One reason is that, when several stages of filters are used, they can all be set to a fixed frequency, which makes them easier to build and to tune. Another reason is that lower frequency transistors generally have higher gains so fewer stages may be required. Yet another reason is to improve frequency selectivity because it may be easier to make sharply selective filters at lower fixed frequencies.

It should also be noted that, while some descriptions provided herein refer to signals 856 and 858 as IF signals, these descriptions are equally applicable to embodiments where signals 856 and 858 are baseband signals. In such embodiments, frequency mixing of the mixers 844 and 848 may be a zero-IF mixing (also referred to as a "zero-IF conversion") in which an LO signal used to perform the mixing may have a center frequency in the band of RF RX/TX frequencies.

In some embodiments, the phase shift module 850 in the LO path may be configured to provide a desired phase shift to the LO signal 860, before providing the LO signal to the mixers 844, 848. Thus, in some embodiments, instead of receiving the LO signal 860 (as may be generated by the LO) at one of their inputs, each of the mixers 844, 848 may receive a phase-shifted version of the LO signal 860. Moving the phase shifting operation to the LO path (e.g., between the LO signal generator and the mixers 844, 848), out of the signal path (e.g., between the digital circuitry that handles the signals 856, 858 and antenna elements 812, and in the wireless domain past the antenna elements 812) may advantageously reduce negative impact of phase shifting on the signal quality.

In other embodiments, the phase shift module 850 shown in FIG. 8 may be omitted. In such embodiments, instead of receiving the phase-shifted version of the LO signal 860 as would be generated by the phase shift module 850, each of the mixers 844, 848 may receive the LO signal 860 itself.

Although not specifically shown in FIG. 8, in further embodiments, the UDC circuit 840 may further include a balancer, e.g., in each of the TX and RX paths, configured to mitigate imbalances in the in-phase and quadrature (IQ) signals due to mismatching. Furthermore, although also not specifically shown in FIG. 8, in other embodiments, the antenna apparatus 800 may include further instances of a combination of the antenna array 810, the beamformer array 820, and the UDC circuit 840 as described herein.

The antenna apparatus 800 can steer an electromagnetic radiation pattern of the antenna array 810 in a particular direction, thereby enabling the antenna array 810 to generate a main beam in that direction and side lobes in other directions. The main beam of the radiation pattern may be generated based on constructive inference of the transmitted RF signals based on the transmitted signals' phases. The side lobe levels may be determined by the amplitudes of the RF signals transmitted by the antenna elements. The antenna apparatus 800 can generate desired antenna patterns by providing phase shifter settings for the antenna elements 812, e.g., using the phase shifters of the beamformers 822 and/or the phase shift module 850 (if the phase shift module 850 is included).

Example Data Processing System

Figure 9:
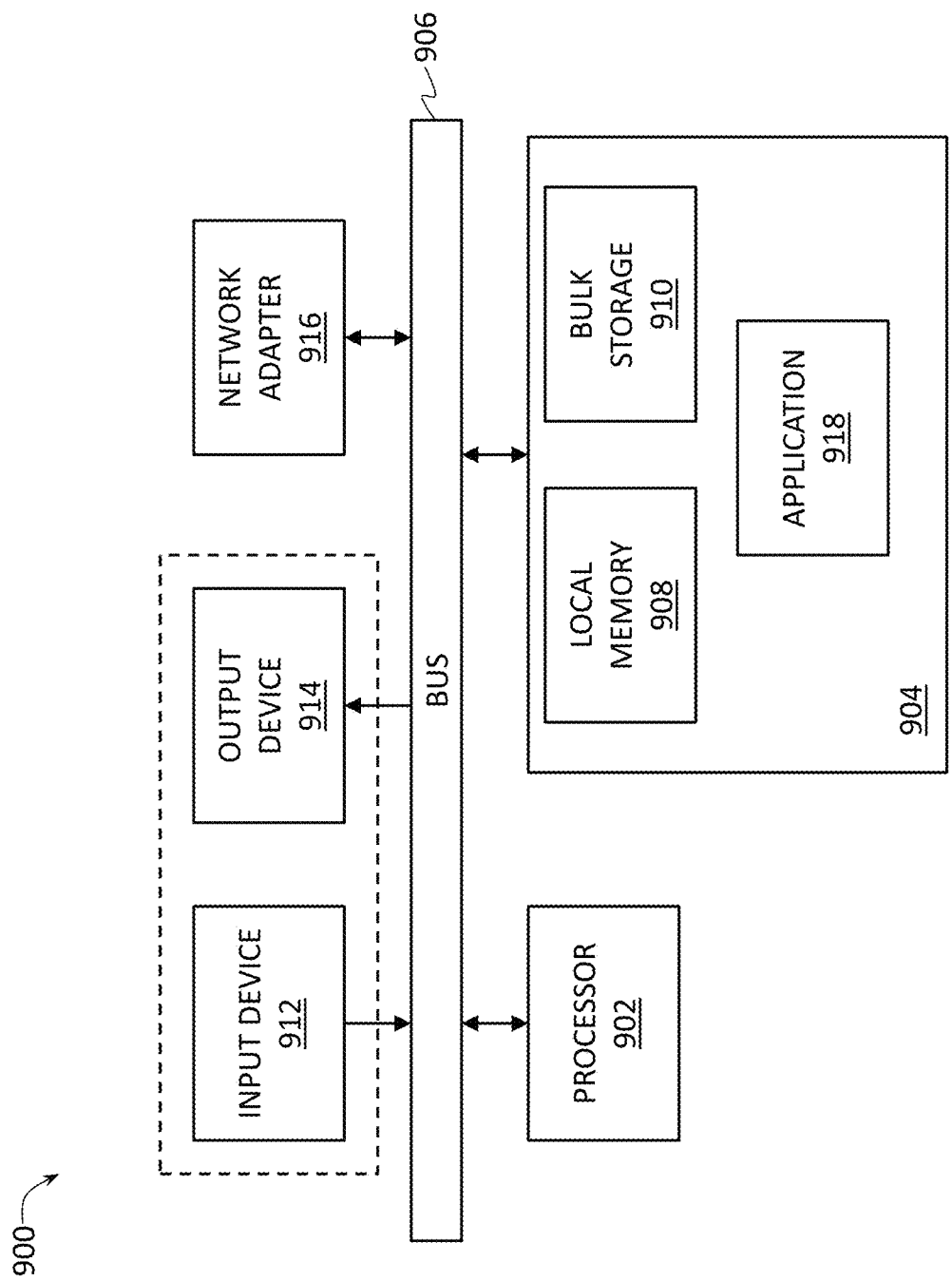
FIG. 9 provides a block diagram illustrating an example data processing system that may be configured to implement, or control, at least portions of operation of an amplifier biased by a bias arrangement with separate bias and linearization circuits coupled by a coupling circuit, according to some embodiments of the present disclosure.

FIG. 9 provides a block diagram illustrating an example data processing system 900 that may be configured to implement, or control implementations of, at least portions of an amplifier biased by a bias arrangement with separate bias and linearization circuits coupled by a coupling circuit as described herein, e.g., of the bias arrangements as described with reference to FIGS. 2-8, according to some embodiments of the present disclosure.

As shown in FIG. 9, the data processing system 900 may include at least one processor 902, e.g. a hardware processor 902, coupled to memory elements 904 through a system bus 906. As such, the data processing system may store program code within memory elements 904. Further, the processor 902 may execute the program code accessed from the memory elements 904 via a system bus 906. In one aspect, the data processing system may be implemented as a computer that is suitable for storing and/or executing program code. It should be appreciated, however, that the data processing system 900 may be implemented in the form of any system including a processor and a memory that is capable of performing, or enabling other components to perform, the functions described within this disclosure.

In some embodiments, the processor 902 can execute software or an algorithm to perform, or enable other components to perform, the activities as discussed in this specification, in particular activities related to implementing and/or operating bias arrangements with separate bias and linearization circuits coupled by a coupling circuit as described herein. The processor 902 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 902 may be communicatively coupled to the memory element 904, for example in a direct-memory access (DMA) configuration, so that the processor 902 may read from or write to the memory elements 904.

In general, the memory elements 904 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 900 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 2-8, can also include suitable interfaces for receiving, transmitting, and/or otherwise communicating data or information in a network environment so that they can communicate with, e.g., the data processing system 900 of another one of these elements.

In certain example implementations, mechanisms for implementing bias arrangements with separate bias and linearization circuits coupled by a coupling circuit to provide modified bias signals to amplifiers as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 904 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 902 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 904 may include one or more physical memory devices such as, for example, local memory 908 and one or more bulk storage devices 910. The local memory may refer to RAM or other non-persistent memory device(s) generally used during actual execution of the program code. A bulk storage device may be implemented as a hard drive or other persistent data storage device. The processing system 900 may also include one or more cache memories (not shown) that provide temporary storage of at least some program code in order to reduce the number of times program code must be retrieved from the bulk storage device 910 during execution.

As shown in FIG. 9, the memory elements 904 may store an application 918. In various embodiments, the application 918 may be stored in the local memory 908, the one or more bulk storage devices 910, or apart from the local memory and the bulk storage devices. It should be appreciated that the data processing system 900 may further execute an operating system (not shown in FIG. 9) that can facilitate execution of the application 918. The application 918, being implemented in the form of executable program code, can be executed by the data processing system 900, e.g., by the processor 902. Responsive to executing the application, the data processing system 900 may be configured to perform one or more operations described herein.

Input/output (I/O) devices depicted as an input device 912 and an output device 914, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 914 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 914. Input and/or output devices 912, 914 may be coupled to the data processing system either directly or through intervening I/O controllers.

In an embodiment, the input and the output devices may be implemented as a combined input/output device (illustrated in FIG. 9 with a dashed line surrounding the input device 912 and the output device 914). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 916 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 900, and a data transmitter for transmitting data from the data processing system 900 to said systems, devices and/or networks. Modems, cable modems, and Ethernet cards are examples of different types of network adapter that may be used with the data processing system 900.

SELECT EXAMPLES

Example 1 provides a bias arrangement for an amplifier, where the amplifier may be one of a power amplifier (e.g., a Doherty amplifier, a class A amplifier, a class B amplifier, a class AB amplifier, or a class C amplifier), a linear amplifier, a low-noise amplifier, or a variable gain amplifier. The bias arrangement includes a bias circuit, including a bias circuit transistor, the bias circuit configured to produce a bias signal for the amplifier; a linearization circuit, including a linearization transistor, the linearization circuit configured to improve linearity of the amplifier by modifying the bias signal produced by the bias circuit to produce a modified bias signal to be provided to the amplifier; and a coupling circuit implemented between the bias circuit and the linearization circuit, the coupling circuit including a coupling transistor.

Example 2 provides the bias arrangement according to example 1, where an output of the coupling transistor is coupled to an input of the bias circuit transistor. In various embodiments, the output of the coupling transistor may be coupled to the input of the bias circuit transistor via a direct electrical connection or via one or more passive or active electrical components in between. For example, in various embodiments, coupling of the output of the coupling transistor to the input of the bias circuit transistor may be realized via, but not limited to, a short circuit, a resistor, an amplifier, an operational amplifier (op-amp), an inductor, a shunt capacitor, or any component configured to set/modify the desired voltage at the output of the coupling transistor.

Example 3 provides the bias arrangement according to example 2, where the output of the coupling transistor is a gate terminal of the coupling transistor if the coupling transistor is a field-effect transistor, or a base terminal of the coupling transistor if the coupling transistor is a bipolar transistor.

Example 4 provides the bias arrangement according to examples 2 or 3, where the input of the bias circuit transistor is a drain terminal of the bias circuit transistor if the bias circuit transistor is a field-effect transistor, or a collector terminal of the bias circuit transistor if the bias circuit transistor is a bipolar transistor.

Example 5 provides the bias arrangement according to any one of examples 2-4, where the bias circuit transistor is a first bias circuit transistor, the bias arrangement further includes a second bias circuit transistor, the second bias circuit transistor arranged in a cascode arrangement with the first bias circuit transistor (where "cascode arrangement" means that the emitter/source terminal of the second transistor is coupled to the drain/collector terminal of the first transistor), and the output of the coupling transistor is coupled to the input of the first bias circuit transistor by the output of the coupling transistor being coupled to an input of the second bias circuit transistor, and an output of the second bias circuit transistor being coupled to the input of the first bias circuit transistor.

Example 6 provides the bias arrangement according to example 5, where the input of the second bias circuit transistor is a drain terminal of the second bias circuit transistor if the second bias circuit transistor is a field-effect transistor, or a collector terminal of the second bias circuit transistor if the second bias circuit transistor is a bipolar transistor.

Example 7 provides the bias arrangement according to examples 5 or 6, where the output of the second bias circuit transistor is a source terminal of the second bias circuit transistor if the second bias circuit transistor is a field-effect transistor, or an emitter terminal of the second bias circuit transistor if the second bias circuit transistor is a bipolar transistor.

Example 8 provides the bias arrangement according to any one of examples 2-7, where the output of the coupling transistor is further coupled to an input of the linearization transistor (which input could be a gate terminal of the linearization transistor if the linearization transistor is a field-effect transistor, or a base terminal of the linearization transistor if the linearization transistor is a bipolar transistor).

Example 9 provides the bias arrangement according to any one of examples 2-8, where the bias arrangement further includes a capacitor including a first capacitor electrode and a second capacitor electrode, the output of the coupling transistor is further coupled to the first capacitor electrode, and the second capacitor electrode is coupled to a ground potential. Because the output of the coupling transistor is coupled to the input of the linearization transistor, the first capacitor electrode is further coupled to the input of the linearization transistor.

Example 10 provides the bias arrangement according to any one of the preceding examples, where each of the bias circuit transistor, the linearization transistor, and the coupling transistor includes a first terminal, a second terminal, and a third terminal. Furthermore, the first terminal of the bias circuit transistor is coupled to the third terminal of the coupling transistor, and the first terminal of the coupling transistor is coupled to the first terminal of the linearization transistor.

Example 11 provides the bias arrangement according to example 10, where the first terminal of the coupling transistor is further coupled to the second terminal of the bias circuit transistor.

In various embodiments, the first terminal of the coupling transistor may be coupled to the second terminal of the bias circuit transistor via a direct electrical connection or via one or more passive or active electrical components in between. For example, in various embodiments, coupling of the first terminal of the coupling transistor to the second terminal of the bias circuit transistor may be realized via, but not limited to, a short circuit, a resistor, an amplifier, an operational amplifier (op-amp), an inductor, a shunt capacitor, or any component configured to set/modify the desired voltage at the first terminal of the coupling transistor.

Example 12 provides the bias arrangement according to examples 10 or 11, where the second terminal of the coupling transistor is coupled to a supply voltage if the coupling transistor is an N-type transistor (e.g., an NMOS or an NPN transistor), or a ground potential if the coupling transistor is a P-type transistor (e.g., a PMOS or a PNP transistor).

Example 13 provides the bias arrangement according to example 12, where the coupling transistor is a first coupling transistor, the bias arrangement further includes a second coupling transistor, the second coupling transistor arranged in a cascode arrangement with the first coupling transistor (where "cascode arrangement" means that the emitter/source terminal of the second transistor is coupled to the drain/collector terminal of the first transistor). If the first coupling transistor is the N-type transistor, then the second terminal of the first coupling transistor is coupled to the supply voltage by the second terminal of the first coupling transistor being coupled to a third terminal of the second coupling transistor and a second terminal of the second coupling transistor being coupled to the supply voltage. If the first coupling transistor is the P-type transistor, then the second terminal of the first coupling transistor is coupled to the ground potential by the second terminal of the first coupling transistor being coupled to a third terminal of the second coupling transistor and a second terminal of the second coupling transistor being coupled to the ground potential.

In further such embodiments, a first terminal of the second coupling transistor may be coupled to a voltage source, which may be configured to provide an optimum voltage to match the Vds of the linearization transistor and/or of the transistor of the amplifier.

Example 14 provides the bias arrangement according to any one of examples 10-13, where the second terminal of the linearization transistor is coupled to a supply voltage if the linearization transistor is an N-type transistor (e.g., an NMOS or an NPN transistor), or a ground potential if the linearization transistor is a P-type transistor (e.g., a PMOS or a PNP transistor).

Example 15 provides the bias arrangement according to example 14, where the linearization transistor is a first linearization transistor, the bias arrangement further includes a second linearization transistor, the second linearization transistor arranged in a cascode arrangement with the first linearization transistor (where "cascode arrangement" means that the emitter/source terminal of the second transistor is coupled to the drain/collector terminal of the first transistor). If the first linearization transistor is the N-type transistor, then the second terminal of the first linearization transistor is coupled to the supply voltage by the second terminal of the first linearization transistor being coupled to a third terminal of the second linearization transistor and a second terminal of the second linearization transistor being coupled to the supply voltage. If the first linearization transistor is the P-type transistor, then the second terminal of the first linearization transistor is coupled to the ground potential by the second terminal of the first linearization transistor being coupled to a third terminal of the second linearization transistor and a second terminal of the second linearization transistor being coupled to the ground potential.

In further such embodiments, a first terminal of the second linearization transistor may be coupled to a voltage source, which may be configured to provide an optimum voltage to match the drain-source voltage (Vds) of the linearization transistor and/or of the transistor of the amplifier.

Example 16 provides a bias arrangement for an amplifier, the bias arrangement including a first transistor, configured to provide, at an output of the first transistor, a bias signal for the amplifier; a second transistor; and a third transistor, where the output of the first transistor is coupled to an input of the second transistor, an output of the second transistor is coupled to an input of the first transistor, the output of the second transistor is further coupled to an input of the third transistor, and the third transistor is configured to provide, at an output of the third transistor, a modified bias signal to be provided to the amplifier, where the modified bias signal is based on the bias signal provided at the output of the first transistor.

Example 17 provides the bias arrangement according to example 16, where the first transistor is an output transistor of a plurality of transistors of a first cascode arrangement, and/or the second transistor is an output transistor of a plurality of transistors of a second cascode arrangement, and/or the third transistor is an output transistor of a plurality of transistors of a third cascode arrangement.

Example 18 provides the bias arrangement according to examples 16 or 17, where the bias arrangement further includes a capacitor including a first capacitor electrode and a second capacitor electrode, the first capacitor electrode is coupled to each of the output of the second transistor and the input of the third transistor, and the second capacitor electrode is coupled to a ground potential.

Example 19 provides a bias arrangement for an amplifier, the bias arrangement including a first transistor, configured to provide, at an output of the first transistor, a bias signal for the amplifier; a second transistor; a third transistor; and a fourth transistor, where the output of the first transistor is coupled to an input of the second transistor, an output of the second transistor is coupled to an input of the first transistor, the output of the second transistor is further coupled to each of an input of the third transistor and an input of the fourth transistor, the third transistor is configured to provide, at an output of the third transistor, a first modified bias signal to be provided to a first input of the amplifier, where the first modified bias signal is based on the bias signal provided at the output of the first transistor, and the fourth transistor is configured to provide, at an output of the fourth transistor, a second modified bias signal to be provided to a second input of the amplifier, where the second modified bias signal is based on the bias signal provided at the output of the first transistor.

Example 20 provides the bias arrangement according to example 19, where the amplifier is a differential amplifier, and where the first input and the second input are, respectively, positive and negative inputs of the differential amplifier.

Example 21 provides an RF system, the RF system including an amplifier, configured to receive an input signal and generate an output signal based on the input signal; and a bias arrangement, configured to provide a bias signal for the amplifier, where the bias arrangement is a bias arrangement according to any one of the preceding examples.

Example 22 provides the RF system according to example 21, further including an antenna element, the antenna element configured to wirelessly transmit an RF signal based on the output signal generated by the amplifier.

Example 23 provides the RF system according to examples 21 or 22, further including a beamforming element, the beamforming element configured to receive a first signal and generate a second signal that is phase-shifted with respect to the first signal, where the input signal to the amplifier is based on the second signal generated by the beamforming element.

Example 24 provides the RF system according to any one of examples 21-23, where the amplifier is one of a power amplifier (e.g., a Doherty amplifier, a class A amplifier, a class B amplifier, a class AB amplifier, or a class C amplifier), a linear amplifier, a low-noise amplifier, or a variable gain amplifier.

Example 25 provides the RF system according to any one of examples 21-24, where the RF system is a mobile device (e.g., a UE of a wireless cellular network).

Example 26 provides the RF system according to any one of examples 21-24, where the RF system is a base station of a wireless cellular network or a transmitter of a cable communications network.

VARIATIONS AND IMPLEMENTATIONS

While embodiments of the present disclosure were described above with references to exemplary implementations as shown in FIGS. 2-9, a person skilled in the art will realize that the various teachings described above are applicable to a large variety of other implementations. For example, descriptions provided herein are applicable not only to 5G systems, which provide one example of wireless communication systems (in particular, an example of high-frequency/short wavelength spectrum, e.g., with frequencies in the range between about 20 and 60 GHz, corresponding to wavelengths in the range between about 5 and 15 millimeters), but also to other wireless communication systems such as, but not limited to, Wi-Fi technology (e.g., a frequency band of 2.4 GHz, corresponding to a wavelength of about 12 cm, or a frequency band of 5.8 GHz, spectrum, corresponding to a wavelength of about 5 cm) or Bluetooth technology (e.g., a frequency band from about 2.4 to about 2.485 GHz, corresponding to a wavelength of about 12 cm). In yet another example, descriptions provided herein are applicable not only to wireless communication systems, but also to any other systems where amplifiers may be used, such as radar systems, automotive radar, and cable communication systems (e.g., cable television systems, etc.).

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, transistors, resistors, capacitors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to bias arrangements with separate bias and linearization circuits coupled by a coupling circuit to provide modified bias signals to amplifiers as described herein.

Parts of various systems for implementing bias arrangements with separate bias and linearization circuits coupled by a coupling circuit, as proposed herein, can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 2-9) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to realizing bias arrangements with separate bias and linearization circuits as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. An electronic component comprising:
    a bias circuit, comprising a bias circuit transistor, the bias circuit to produce a bias signal for an amplifier;
    a linearization circuit, comprising a linearization transistor, the linearization circuit to generate a modified bias signal for the amplifier based on the bias signal; and
    a coupling circuit implemented between the bias circuit and the linearization circuit, the coupling circuit comprising a coupling transistor,
    wherein:
    each of the bias circuit transistor, the linearization transistor, and the coupling transistor includes a first terminal, a second terminal, and a third terminal,
    the first terminal of the bias circuit transistor is coupled to the third terminal of the coupling transistor, and
    the first terminal of the coupling transistor is coupled to the first terminal of the linearization transistor.

2. The electronic component according to claim 1, wherein an output of the coupling transistor is coupled to an input of the bias circuit transistor.

3. The electronic component according to claim 2, wherein the electronic component further includes a capacitor comprising a first capacitor electrode and a second capacitor electrode, the output of the coupling transistor is further coupled to the first capacitor electrode, and the second capacitor electrode is coupled to a ground potential.

4. The electronic component according to claim 1, wherein the first terminal of the coupling transistor is further coupled to the second terminal of the bias circuit transistor.

5. The electronic component according to claim 1, wherein the second terminal of the coupling transistor is coupled to:
    a supply voltage if the coupling transistor is an N-type transistor, or
    a ground potential if the coupling transistor is a P-type transistor.

6. The electronic component according to claim 5, wherein:
    the coupling transistor is a first coupling transistor,
    the electronic component further includes a second coupling transistor, the second coupling transistor arranged in a cascode arrangement with the first coupling transistor, and
    if the first coupling transistor is the N-type transistor, then the second terminal of the first coupling transistor is coupled to the supply voltage by the second terminal of the first coupling transistor being coupled to a third terminal of the second coupling transistor and a second terminal of the second coupling transistor being coupled to the supply voltage, or
    if the first coupling transistor is the P-type transistor, then the second terminal of the first coupling transistor is coupled to the ground potential by the second terminal of the first coupling transistor being coupled to a third terminal of the second coupling transistor and a second terminal of the second coupling transistor being coupled to the ground potential.

7. The electronic component according to claim 1, wherein the second terminal of the linearization transistor is coupled to:
    a supply voltage if the linearization transistor is an N-type transistor, or
    a ground potential if the linearization transistor is a P-type transistor.

8. The electronic component according to claim 7, wherein:
    the linearization transistor is a first linearization transistor,
    the electronic component further includes a second linearization transistor, the second linearization transistor arranged in a cascode arrangement with the first linearization transistor, and
    if the first linearization transistor is the N-type transistor, then the second terminal of the first linearization transistor is coupled to the supply voltage by the second terminal of the first linearization transistor being coupled to a third terminal of the second linearization transistor and a second terminal of the second linearization transistor being coupled to the supply voltage, or
    if the first linearization transistor is the P-type transistor, then the second terminal of the first linearization transistor is coupled to the ground potential by the second terminal of the first linearization transistor being coupled to a third terminal of the second linearization transistor and a second terminal of the second linearization transistor being coupled to the ground potential.

9. An electronic component, comprising:
    a first transistor, to provide, at an output of the first transistor, a bias signal for an amplifier;
    a second transistor; and
    a third transistor, wherein:
the output of the first transistor is coupled to an input of the second transistor,
an output of the second transistor is coupled to an input of the first transistor,
the output of the second transistor is further coupled to an input of the third transistor, and
the third transistor is provide, at an output of the third transistor, a modified bias signal to be provided to the amplifier, where the modified bias signal is based on the bias signal.

10. The electronic component according to claim 9, wherein:
the first transistor is an output transistor of a plurality of transistors of a first cascode arrangement, and/or
the second transistor is an output transistor of a plurality of transistors of a second cascode arrangement, and/or
the third transistor is an output transistor of a plurality of transistors of a third cascode arrangement.

11. The electronic component according to claim 9, wherein the electronic component further includes a capacitor comprising a first capacitor electrode and a second capacitor electrode, the first capacitor electrode is coupled to each of the output of the second transistor and the input of the third transistor, and the second capacitor electrode is coupled to a ground potential.

12. A electronic component for an amplifier, the electronic component comprising:
a first transistor, to provide, at an output of the first transistor, a bias signal for the amplifier;
a second transistor;
a third transistor; and
a fourth transistor,
wherein:
the output of the first transistor is coupled to an input of the second transistor,
an output of the second transistor is coupled to an input of the first transistor,
the output of the second transistor is further coupled to each of an input of the third transistor and an input of the fourth transistor,
the third transistor is to provide, at an output of the third transistor, a first modified bias signal to be provided to a first input of the amplifier, where the first modified bias signal is based on the bias signal provided at the output of the first transistor, and
the fourth transistor is to provide, at an output of the fourth transistor, a second modified bias signal to be provided to a second input of the amplifier, where the second modified bias signal is based on the bias signal provided at the output of the first transistor.

13. The electronic component according to claim 12, wherein the amplifier is a differential amplifier, and wherein the first input and the second input are, respectively, positive and negative inputs of the differential amplifier.

14. The electronic component according to claim 1, wherein the electronic component is a bias arrangement for the amplifier.

15. The electronic component according to claim 1, further comprising the amplifier.

16. The electronic component according to claim 1, further comprising a beamforming element, the beamforming element to receive a first signal and generate a second signal that is phase-shifted with respect to the first signal, where an input signal to the amplifier is based on the second signal generated by the beamforming element.

17. The electronic component according to claim 16, further comprising the amplifier.

18. The electronic component according to claim 16, further comprising an antenna element, the antenna element to transmit an RF signal based on a signal generated by the amplifier.

19. The electronic component according to claim 16, wherein the electronic component is a radio frequency (RF) transceiver.

20. The electronic component according to claim 9, wherein:
the output of the second transistor is a gate terminal of the second transistor when the second transistor is a field-effect transistor (FET), and is a base terminal of the second transistor when the second transistor is a bipolar junction transistor (MT),
the input of the third transistor is a gate terminal of the third transistor when the third transistor is a FET, and is a base terminal of the third transistor when the third transistor is a BJT, and
the output of the second transistor is directly coupled to the input of the third transistor.

21. The electronic component according to claim 9, wherein the electronic component is a bias arrangement for the amplifier.

22. The electronic component according to claim 9, further comprising the amplifier.

23. The electronic component according to claim 9, further comprising a beamforming element, the beamforming element to receive a first signal and generate a second signal that is phase-shifted with respect to the first signal, where an input signal to the amplifier is based on the second signal generated by the beamforming element.

24. The electronic component according to claim 23, further comprising the amplifier.

25. The electronic component according to claim 23, further comprising an antenna element, the antenna element to transmit an RF signal based on a signal generated by the amplifier.

26. The electronic component according to claim 23, wherein the electronic component is a radio frequency (RF) transceiver.

27. The electronic component according to claim 12, wherein the electronic component is a bias arrangement for the amplifier.

28. The electronic component according to claim 12, further comprising the amplifier.

29. The electronic component according to claim 12, further comprising a beamforming element, the beamforming element to receive a first signal and generate a second signal that is phase-shifted with respect to the first signal, where an input signal to the amplifier is based on the second signal generated by the beamforming element.

30. The electronic component according to claim 29, further comprising the amplifier.

31. The electronic component according to claim 29, further comprising an antenna element, the antenna element to transmit an RF signal based on a signal generated by the amplifier.

32. The electronic component according to claim 29, wherein the electronic component is a radio frequency (RF) transceiver.

33. The electronic component according to claim 2, wherein the output of the coupling transistor is:
a gate terminal of the coupling transistor if the coupling transistor is a field-effect transistor, or a base terminal of the coupling transistor if the coupling transistor is a bipolar transistor.

34. The electronic component according to claim 2, wherein the input of the bias circuit transistor is:
  a drain terminal of the bias circuit transistor if the bias circuit transistor is a field-effect transistor, or
  a collector terminal of the bias circuit transistor if the bias circuit transistor is a bipolar transistor.

35. The electronic component according to claim 2, wherein:
  the bias circuit transistor is a first bias circuit transistor,
  the bias arrangement further includes a second bias circuit transistor, the second bias circuit transistor arranged in a cascode arrangement with the first bias circuit transistor, and
  the output of the coupling transistor is coupled to the input of the first bias circuit transistor by the output of the coupling transistor being coupled to an input of the second bias circuit transistor, and an output of the second bias circuit transistor being coupled to the input of the first bias circuit transistor.

36. The electronic component according to claim 35, wherein the input of the second bias circuit transistor is:
  a drain terminal of the second bias circuit transistor if the second bias circuit transistor is a field-effect transistor, or
  a collector terminal of the second bias circuit transistor if the second bias circuit transistor is a bipolar transistor.

37. The electronic component according to claim 35, wherein the output of the second bias circuit transistor is:
  a source terminal of the second bias circuit transistor if the second bias circuit transistor is a field-effect transistor, or
  an emitter terminal of the second bias circuit transistor if the second bias circuit transistor is a bipolar transistor.

38. The electronic component according to claim 35, wherein the output of the coupling transistor is further coupled to an input of the linearization transistor.

\* \* \* \* \*